(12) United States Patent
Shimazu et al.

(10) Patent No.: US 8,337,960 B2
(45) Date of Patent: Dec. 25, 2012

(54) SEASONING METHOD FOR FILM-FORMING APPARATUS

(75) Inventors: Tadashi Shimazu, Kobe (JP); Yuichi Kawano, Takasago (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 514 days.

(21) Appl. No.: 12/282,475

(22) PCT Filed: Feb. 19, 2007

(86) PCT No.: PCT/JP2007/052921
§ 371 (c)(1),
(2), (4) Date: May 5, 2009

(87) PCT Pub. No.: WO2007/105412
PCT Pub. Date: Sep. 20, 2007

(65) Prior Publication Data
US 2009/0242511 A1   Oct. 1, 2009

(30) Foreign Application Priority Data
Mar. 10, 2006 (JP) .................. 2006-065415

(51) Int. Cl.
*C23C 16/00* (2006.01)
(52) U.S. Cl. .................. 427/579; 427/569; 427/578
(58) Field of Classification Search .................. None
See application file for complete search history.

(56) References Cited

U.S. PATENT DOCUMENTS

| | | | | |
|---|---|---|---|---|
| 5,324,360 A | * | 6/1994 | Kozuka | 118/719 |
| 5,821,603 A | * | 10/1998 | Puntambekar | 257/640 |
| 5,951,773 A | * | 9/1999 | Jang et al. | 118/723 R |
| 6,121,161 A | | 9/2000 | Rossman et al. | |
| 6,534,007 B1 | | 3/2003 | Blonigan et al. | |
| 2001/0019903 A1 | * | 9/2001 | Shufflebotham et al. | 438/788 |
| 2002/0045966 A1 | * | 4/2002 | Lee et al. | 700/121 |
| 2003/0143410 A1 | * | 7/2003 | Won et al. | 428/448 |
| 2005/0214477 A1 | * | 9/2005 | Hanawa et al. | 427/569 |
| 2006/0130891 A1 | * | 6/2006 | Carlson | 136/256 |
| 2009/0056743 A1 | * | 3/2009 | Choi et al. | 134/1.1 |

FOREIGN PATENT DOCUMENTS

| | | |
|---|---|---|
| JP | 8-31750 A | 2/1996 |
| JP | 8-31752 A | 2/1996 |
| JP | 11-16845 A | 1/1999 |

(Continued)

OTHER PUBLICATIONS

Kilper, Journal of Applied Physics, vol. 105, 2009 (evidence supplied by applicants, Jul. 18, 2012).*

(Continued)

*Primary Examiner* — Joseph Miller, Jr.
(74) *Attorney, Agent, or Firm* — Westerman, Hattori, Daniels & Adrian, LLP

(57) ABSTRACT

A seasoning method for a film-forming apparatus configured to form a silicon nitride film on a substrate placed in a process chamber. The method is conducted for reducing particles in the apparatus. The method comprises executing the plasma cleaning of the process chamber to remove a film deposited on the inner wall thereof (step S1), subsequently depositing an amorphous silicon film (step S2), depositing thereon a silicon nitride film in which the nitrogen content gradually increases in the thickness direction (step S3), and keeping the inside of the process chamber being filled with a rare-gas plasma until film formation on the substrate is initiated (step S4).

2 Claims, 4 Drawing Sheets

FOREIGN PATENT DOCUMENTS

| | | |
|---|---|---|
| JP | 11-224858 A | 8/1999 |
| TW | 409289 B | 10/2000 |

OTHER PUBLICATIONS

Wordenweber, Dissertation, English abstract on p. V, Dec. 2010 (evidence supplied by applicants, Jul. 18, 2012).*

Madee, EUPVSEC Proceedings, downloaded Jul. 18, 2012 (evidence supplied by applicants, Jul. 18, 2012).*
Taiwanese Office Action dated Jun. 10, 2010, issued in corresponding Taiwanese Patent Application No. 096107225.
International Search Report of PCT/JP2007/052921, date of mailing May 15, 2007.

* cited by examiner

1 Inner Wall of Vacume Chamber

SEASONING METHOD FOR FILM-FORMING APPARATUS

TECHNICAL FIELD

The present invention relates to a seasoning method for a film-forming apparatus, which is suitable for a plasma CVD apparatus or the like configured to form films constituting a semiconductor device, for example.

BACKGROUND ART

In order to form films that constitute a semiconductor device in a semiconductor process, films are formed on a substrate by use of a film-forming apparatus such as a plasma CVD apparatus. At this time, films to be formed are attached not only onto the substrate but also onto an inner wall of a processing chamber of the film-forming apparatus. The films attached to the inner wall of the processing chamber are further deposited thereon each time films are formed on the substrate, and are peeled off if they are left intact and may cause particles. Accordingly, plasma cleaning is periodically performed to remove the unnecessary films attached to the inner wall. Moreover, in order to suppress contaminants and to stabilize the process, a film formation process for a predetermined amount is usually performed with no substrate while formed under the same conditions as film formation on the substrate (seasoning).
Patent Document 1: JP-A 11-16845

DISCLOSURE OF THE INVENTION

Problems to be Solved by the Invention

Seasoning is necessary for stabilizing the process. However, in the case of a silicon nitride film, the film itself has high stress and low adhesion to the inner wall of the processing chamber. Therefore, the film is apt to be peeled off from the inner wall of the processing chamber, and to become particles, thereby leading to a problem that the generation of particles cannot be reduced.

The present invention has been made in view of the foregoing problem and aims at providing a seasoning method for a film-forming apparatus configured to reduce the generation of particles.

Means for Solving the Problem

A seasoning method for a film-forming apparatus described in a first invention to solve the above problem is a seasoning method for a film-forming apparatus configured to form a silicon nitride film on a substrate placed in a processing chamber, comprising: supplying a cleaning gas into the processing chamber, and etching the silicon nitride film attached to an inner wall of the processing chamber while converting the cleaning gas into a plasma state; supplying a silicon-containing gas into the processing chamber, and depositing an amorphous silicon film on the inner wall of the processing chamber while converting the silicon-containing gas into a plasma state; supplying the silicon-containing gas into the processing chamber, while supplying a nitrogen-containing gas in a gradually increasing manner up to a predetermined flow rate, and thus depositing, on the amorphous silicon film, a silicon nitride film with the nitrogen content gradually increasing in a thickness direction, while converting the silicon-containing gas and the nitrogen-containing gas into a plasma state; and supplying a rare gas into the processing chamber, and maintaining a plasma state of the rare gas until film formation of the silicon nitride film on the substrate is initiated.

A seasoning method for a film-forming apparatus described in a second invention to solve the above problem is the seasoning method for a film-forming apparatus according to the first invention, wherein the nitrogen-containing gas is supplied in a gradually increasing manner up to the predetermined flow rate gently in the beginning and more rapidly thereafter when depositing the silicon nitride film on the amorphous silicon film.

Effects of the Invention

According to the present invention, the amorphous silicon film is deposited after performing plasma cleaning (etching) of the film attached to the inner wall of the processing chamber, and the silicon nitride film in which the nitrogen content is gradually increased in the thickness direction is deposited thereon. Moreover, the inside of the processing chamber is maintained with the rare gas plasma until film formation on the substrate is initiated. Therefore, it is possible to reduce particles at the time of film formation on the substrate.

DESCRIPTION OF SYMBOLS

1 VACUUM CHAMBER
2 PROCESSING CHAMBER
3 CEILING PLATE
4 SUPPORT TABLE
5 SUBSTRATE
7 ANTENNAS
8 MATCHING BOX
9 HIGH-FREQUENCY POWER SOURCE
10a, 10b GAS NOZZLES
11 EXHAUST PORT
12 ANTENNA
13 MATCHING BOX
14 ALTERNATING-CURRENT POWER SOURCE

BEST MODE FOR CARRYING OUT THE INVENTION

A seasoning method for a film-forming apparatus according to the present invention will be described in detail by using FIG. 1 to FIG. 4(c).

EXAMPLE 1

Figure 1:
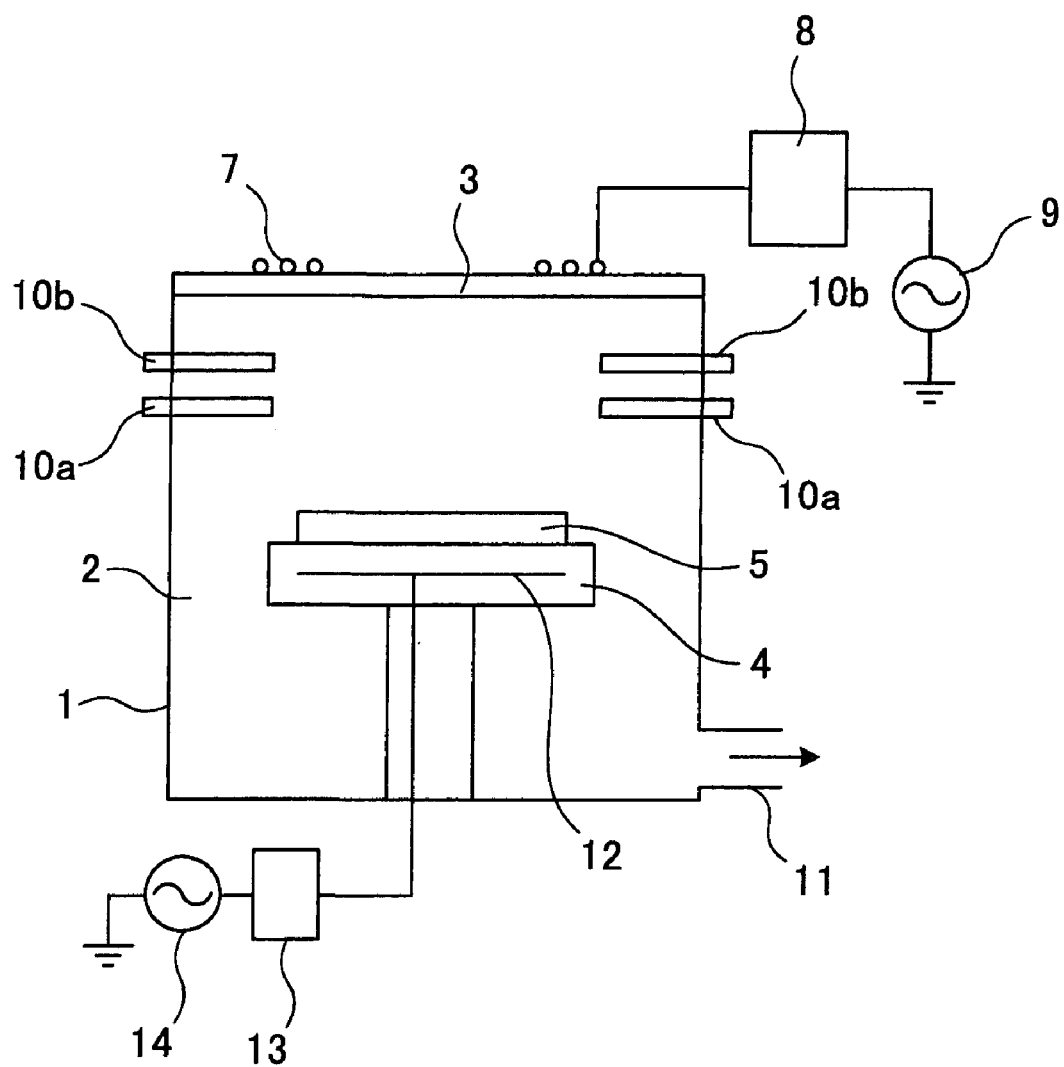
FIG. 1 is a schematic configuration diagram showing an example of an embodiment of a film-forming apparatus in the present invention.

FIG. 1 is a schematic configuration diagram showing an example of an embodiment of a film-forming apparatus according to the present invention.

As shown in FIG. 1, in the film-forming apparatus according to the present invention, the inside of a cylindrical vacuum chamber 1 made of aluminum is configured to serve as a processing chamber 2 (a treatment vessel), and a discoid ceiling plate 3 made of a ceramic constituting an electromagnetic wave transmissive window is disposed on an upper opening portion of the vacuum chamber 1 so as to occlude the opening portion. Meanwhile, a support table 4 is provided in the lower part of the vacuum chamber 1 and a substrate 5 such as a semiconductor is placed on an upper surface of the support table 4.

Multiple high-frequency antennas 7 made of circular rings, for example, are disposed on an upper part of the ceiling plate 3, and a high-frequency power source 9 for plasma generation is connected to one of the high-frequency antennas 7 through a matching box 8 configured to perform impedance matching.

Moreover, the vacuum chamber 1 is provided with gas nozzles 10a and 10b for introducing desired gases into the processing chamber 2, and is also provided with an exhaust port 11. The exhaust port 11 is connected to an unillustrated vacuum pumping system, and the inside of the processing chamber 2 is controlled to a desired pressure by using this vacuum pumping system.

The support table 4 for supporting the substrate 5 is provided with an antenna 12. An alternating-current power source 14 for biasing is connected to this antenna 12 through a matching box 13 configured to perform impedance matching. The antenna 12 functions as a bias electrode for applying bias power to the substrate 5.

In the film-forming apparatus having the above-described configuration, by supplying high-frequency power from the high-frequency power source 9 to the high-frequency antenna 7, an electromagnetic wave from the high-frequency antenna 7 passes through the ceiling plate 3, and is made incident on the processing chamber 2. The gases introduced into the processing chamber 2 through the gas nozzles 10a and 10b are ionized by energy of the incident electromagnetic wave to generate plasma. Then, a desired plasma process such as etching or CVD (Chemical Vapor Deposition) is performed on the substrate 5 by using the generated plasma.

For instance, in the case of forming a $Si_xN_y$ film (silicon nitride film) on the substrate 5, a plasma process is executed by supplying $SiH_4$ (silane) or the like, for example, as a raw material gas, whereas supplying $NH_3$ (ammonia), $N_2$ (nitrogen) or the like, for example, as a nitriding gas. Thus, the silicon nitride film having a desired film thickness is formed on each substrate 5 one by one. Then, plasma cleaning is usually executed periodically by use of $NF_3$ (nitrogen trifluoride). Thereafter, seasoning is performed under the same conditions as film formation on the substrate for the purpose of process stabilization.

Figure 2:
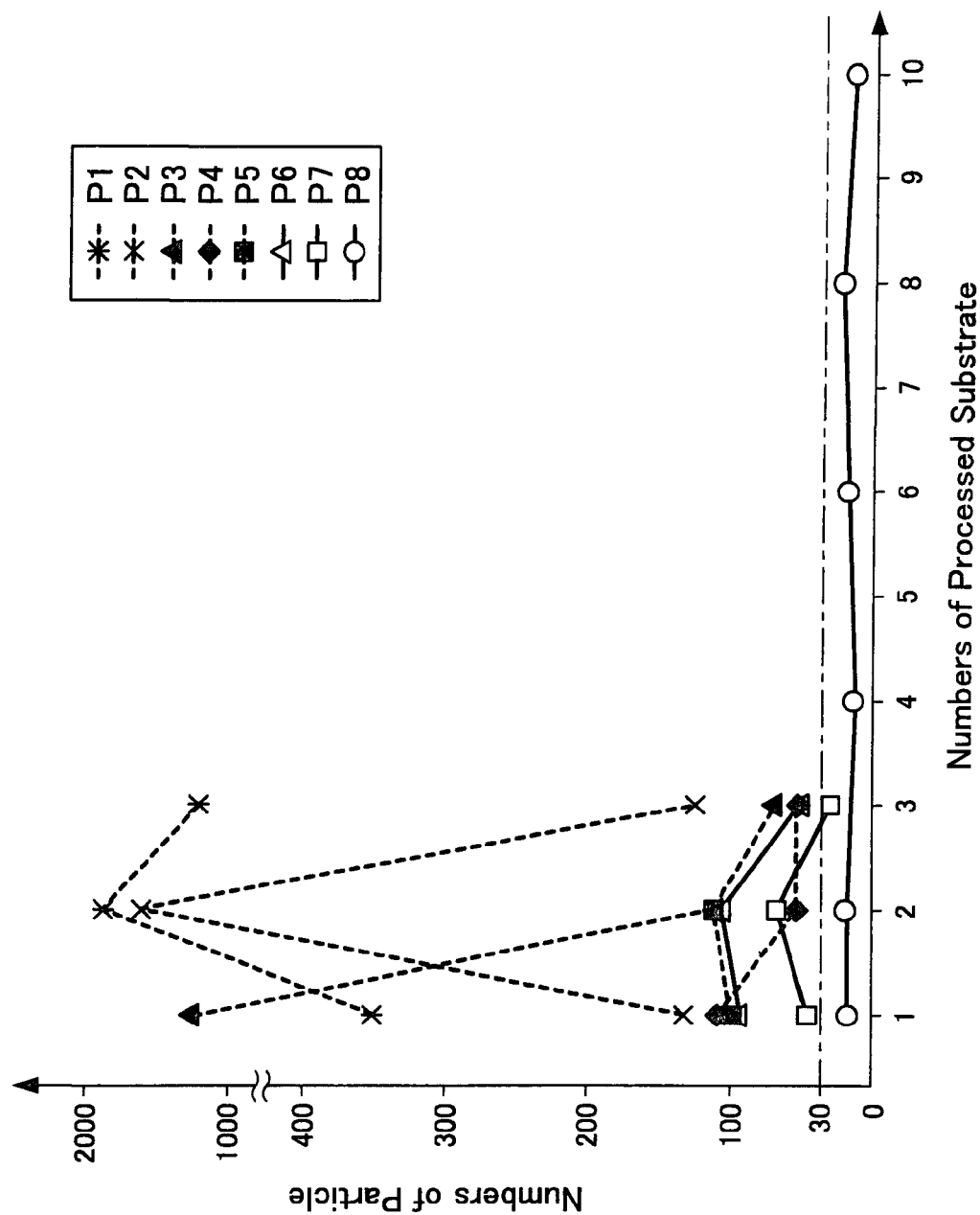
FIG. 2 is a graph showing transition of particles under process conditions P1 to P8.

However, as described previously, the $Si_xN_y$ film has large stress of the film itself and poor adhesion to the vacuum chamber 1. Accordingly, it has been difficult to reduce particles to a desired level. Therefore, the inventors of the present invention acquired the most suitable seasoning method for reducing particles, based on the knowledge shown in FIG. 2 and so forth. Note that FIG. 2 is a graph showing transition of particles under process conditions P1 to P8 described below. Meanwhile, the lateral axis indicates the number of processed substrates subjected to the processes. Measurement of particles is conducted by selecting an arbitrary number of multiple substrates from the substrates subjected to the process.

First, a film to be deposited on an inner wall of the vacuum chamber 1 is limited only to α-Si film (an amorphous silicon film), and transition of particles is measured by changing the film thickness to 0.28 μm (P1), 0.55 μm (P2), 0.83 μm (P3), 1.1 μm (P4), and 1.65 μm (P5). As apparent from the graph in FIG. 2, the particles tend to be reduced along with the increase in the deposited film thickness when changing the film thickness for depositing the α-Si film. However, there is not a large difference between 1.1 μm (P4) and the 1.65 μm (P5), and the most suitable deposited film thickness of the α-Si film turns out to be around 1.1 μm.

Therefore, in the process condition of P6, transition of particles is measured by setting the deposited film thickness of the α-Si film to 1.1 μm, based on the foregoing results, and depositing 0.7 μm of a $Si_xN_y$ film on the α-Si film. In this case, there is not a large difference from the cases of P4 and P5 as shown in the graph in FIG. 2.

Next, in the process condition of P7, transition of particles is measured by depositing a $Si_xN_y$ film, based on the result of P6, and increasing an amount of supply of $N_2$ gradually up to a predetermined flow rate when depositing the $Si_xN_y$ film on the α-Si film. In this case, as shown in the graph in FIG. 2, the level of particles becomes lower than the case of P6.

Then in the process condition of P8, transition of particles is measured by maintaining Ar plasma, based on the result of P7, after completion of a seasoning process for depositing the α-Si film and the $Si_xN_y$ film until initiation of film formation on the substrate 5. In this case, as shown in the graph in FIG. 2, the level of particle becomes even lower than the case of P7, and the number of particles becomes equal to or below 30 pieces in every session of the measurement. Note that $N_2$ plasma is maintained in P1 to P6 unlike P7.

Figure 3:
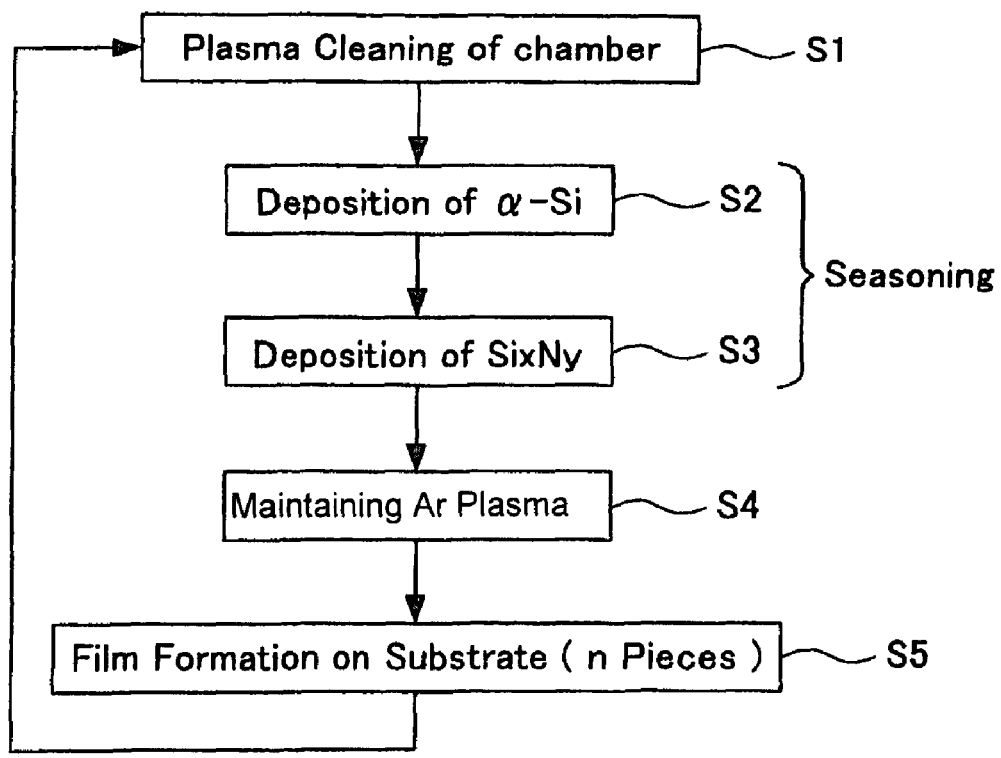
FIG. 3 is a flowchart explaining a seasoning method for a film-forming apparatus according to the present invention.

Here, a seasoning method for a film-forming apparatus according to the present invention obtained based on the above-described knowledge will be described by using FIG. 3 to FIG. 4(c).

First, plasma cleaning inside the vacuum chamber 1 is performed. This is executed periodically or once in every predetermined n pieces of the substrates (n is a natural number equal to or above 1), for example. At the time of this plasma cleaning, a cleaning gas including predetermined flow rates of $NF_3$, Ar (argon) and the like is supplied into the vacuum chamber 1, and plasma cleaning of the inner wall and the like of the vacuum chamber 1 is performed by converting, into a plasma state, the gas introduced into the vacuum chamber 1. Thus, etching is performed for the film attached to the inner wall and the like of the vacuum chamber 1 (Step S1).

Next, a predetermined flow rate of $SiH_4$ is supplied into the vacuum chamber 1, and converted into a plasma state. Then a predetermined film thickness of the α-Si film is deposited on the inner wall and the like of the vacuum chamber 1, thereby coating the inner wall and the like of the vacuum chamber 1 (Step S2).

Next, $N_2$ is supplied in a gradually increasing manner up to a predetermined flow rate and similarly converted into a plasma state so as to perform coating by depositing a predetermined film thickness of the $Si_xN_y$ film (the silicon nitride film) on the α-Si film (Step S3). Thus, a series of plasma cleaning and seasoning processes is completed.

Figure 4A:
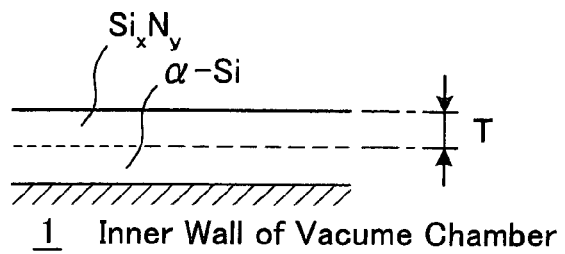
FIGS. 4(a) to 4(c) are views explaining a deposition state of each film and a supply state of a nitrogen flow rate in the seasoning method for a film-forming apparatus according to the present invention.
Figure 4B:
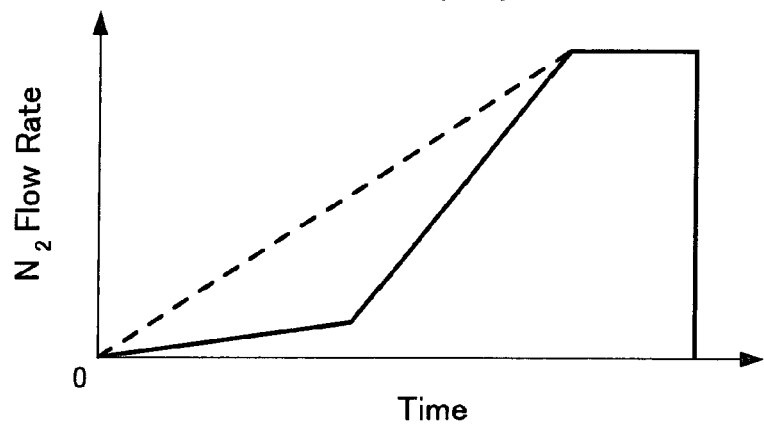

According to the above-described procedures, the α-Si film and the $Si_xN_y$ film are sequentially laminated on the inner wall and the like of the vacuum chamber 1 (see FIG. 4(a)), and N2 is supplied in a gradually increasing manner up to the predetermined flow rate at the time of deposition of the $Si_xN_y$ film (see a graph in FIG. 4(b)). Therefore, the α-Si film and the $Si_xN_y$ film are sequentially laminated, while gently forming an interface between the α-Si film and the $Si_xN_y$ film (in a state of not forming a clear interface). As a consequence, it is possible to render the seasoned $Si_xN_y$ film hardly removable from the inner wall and the like of the vacuum chamber 1.

Figure 4C:
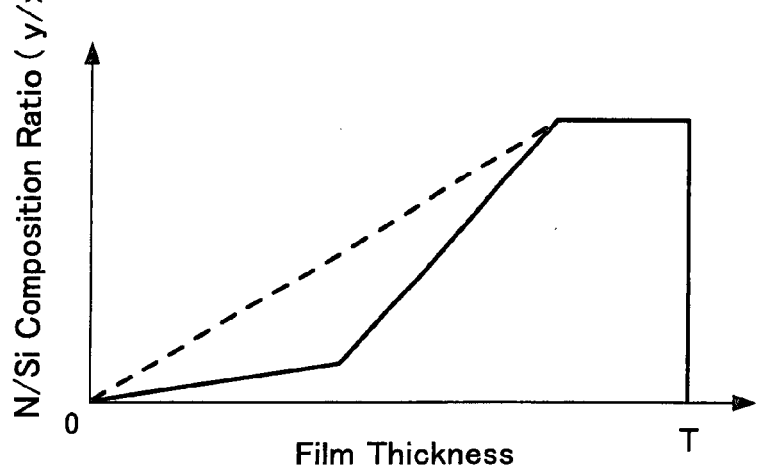

At this time, a composition ratio (y/x) of N/Si in the $Si_xN_y$ film is gradually increased in a thickness direction of the film thickness T thereof as shown in a graph in FIG. 4(c). This variation in the composition ratio in the thickness direction can be changed in response to a method of supplying $N_2$. For example, as shown in a solid line of the graph in FIG. 4(b), when gradually increasing the amount of supply of $N_2$ up to the predetermined flow rate through multiple stages (two stages of the gradual increase including a gentle increase in the beginning and a more rapid increase thereafter), the composition ratio of N/Si in the $Si_xN_y$ film also forms a similar profile as shown in a solid line of the graph in FIG. 4(c). Meanwhile, as shown in a dotted line of the graph in FIG. 4(b), when gradually increasing the amount of supply of $N_2$ up to the predetermined flow rate in one stage (at a constant inclination), the composition ratio of N/Si in the $Si_xN_y$ film also forms a similar profile as shown in a dotted line of the graph in FIG. 4(c).

After the above-described series of processes, a predetermined flow rate of Ar is supplied into the vacuum chamber 1 and Ar supplied into the vacuum chamber 1 is converted into a plasma state. Then the Ar plasma is maintained inside the vacuum chamber 1 (Step S4). Thereafter, in the state of maintaining the Ar plasma, the substrate 5 is conveyed and placed on the support table 4 of the vacuum chamber 1, and film formation of the silicon nitride film on the substrate 5 is carried out as usual. After carrying out the film formation on n pieces of the substrates 5, the process returns to Step S1 and the series of the plasma cleaning and seasoning processes is started again (Step S5). Note that, it is also possible to use other rare gases instead of Ar in this step.

Concerning the plasma generated inside the vacuum chamber 1, it is possible to stop generation thereof (stop incidence of the electromagnetic wave) in each of the above-described steps. However, it is also possible to maintain the plasma state during the series of steps, namely, during the plasma cleaning, seasoning, and Ar plasma processes.

In the present invention, the physical characteristics of the silicon nitride film of being apt to be peeled off and to become particles are changed by executing the seasoning method for a film-forming apparatus (the series of the plasma cleaning, seasoning processes and the like) in accordance with the above-described procedures. As a consequence, it is possible to render the silicon nitride film less removable, to reduce an amount of generation of particles, and thereby to stabilize the process.

This is presumably because the stress of the silicon nitride film itself is relaxed and adhesion thereof is also improved by laminating the silicon nitride film having the nitrogen content gradually increased in the thickness direction on the inner wall and the like of the vacuum chamber 1 through the α-Si film, and the silicon nitride film becomes less removable as a consequence. In particular, it is presumably more desirable to form the interface between the α-Si film and the silicon nitride film gently by means of gradually increasing the amount of supply of $N_2$ gently in the beginning and then more rapidly thereafter.

Moreover, in terms of maintaining the Ar plasma in the course of conveying the substrate 5, particles are usually charged negatively in the plasma so that the Ar plasma traps more particles by maintaining the Ar plasma that has more positive plasma potential than the N2 plasma, thereby reducing more particles as a consequence.

INDUSTRIAL APPLICABILITY

Although the seasoning method for a film-forming apparatus according to the present invention is suitable for a silicon nitride film having high stress of the film itself and having poor adhesion, it is also applicable to other films having similar properties to the silicon nitride film.

The invention claimed is:

1. A seasoning method for a silicon nitride film-forming apparatus configured to make an electromagnetic wave incident on a processing chamber of the silicon nitride film-forming apparatus from an antenna of a circular ring shape disposed outside the processing chamber through an electromagnetic wave transmissive window provided on the processing chamber and thus to convert a silicon-containing gas and a nitrogen-containing gas supplied into the processing chamber into a plasma state, thereby forming a silicon nitride film on a substrate placed in the processing chamber, characterized by comprising the steps of:

supplying a cleaning gas into the processing chamber, and etching the silicon nitride film attached to an inner wall of the processing chamber while converting the cleaning gas into a plasma state;

supplying the silicon-containing gas into the processing chamber, and depositing an amorphous silicon film on the inner wall of the processing chamber while converting the silicon-containing gas into a plasma state;

supplying the silicon-containing gas into the processing chamber, while supplying the nitrogen-containing gas in a gradually increasing manner up to a predetermined flow rate, and thus depositing, on the amorphous silicon film, a silicon nitride film with the nitrogen content gradually increasing in a thickness direction, while converting the silicon-containing gas and the nitrogen-containing gas into a plasma state; and supplying a rare gas into the processing chamber and maintaining a plasma state of the rare gas until film formation of the silicon nitride film on the substrate is initiated including a period of conveying the substrate to the processing chamber.

2. The seasoning method for a silicon nitride film-forming apparatus according to claim 1, characterized in that the nitrogen-containing gas is supplied in a gradually increasing manner up to the predetermined flow rate gently in the beginning and more rapidly thereafter when depositing the silicon nitride film on the amorphous silicon film.

\* \* \* \* \*